United States Patent [19]

Okanuma

[11] Patent Number: 4,673,843
[45] Date of Patent: Jun. 16, 1987

[54] DC DISCHARGE LAMP

[75] Inventor: Tsuneo Okanuma, Takasago, Japan

[73] Assignee: Ushio Denki Kabushiki Kaisha, Tokyo, Japan

[21] Appl. No.: 799,583

[22] Filed: Nov. 19, 1985

[30] Foreign Application Priority Data

May 16, 1985 [JP] Japan .................... 60-102676

[51] Int. Cl.$^4$ ............ H01J 61/12; H01J 61/35; H01J 61/36
[52] U.S. Cl. ............ 313/570; 313/623; 313/635; 313/318
[58] Field of Search ........... 313/632, 623, 635, 318, 313/570, 43

[56] References Cited

U.S. PATENT DOCUMENTS

| | | | |
|---|---|---|---|
| 2,177,714 | 10/1939 | Hagen et al. ............ | 313/623 |
| 2,467,687 | 4/1949 | Noel ........................ | 313/571 |
| 4,190,786 | 2/1980 | Kira ......................... | 313/570 X |

FOREIGN PATENT DOCUMENTS

| | | | |
|---|---|---|---|
| 0480789 | 3/1953 | Italy ................. | 313/43 |
| 0025217 | 7/1973 | Japan .............. | 313/623 |
| 0116263 | 9/1981 | Japan .............. | 313/43 |
| 0465137 | 3/1937 | United Kingdom | 313/43 |

Primary Examiner—Palmer C. DeMeo
Attorney, Agent, or Firm—Robert F. Ziems

[57] ABSTRACT

An electrically-conductive member is provided on the outer wall of a cathode-sealing portion of a dc discharge lamp such as a super high pressure mercury vapor lamp, and the electrically-conductive member is electrically connected to a sealed cathodic conductor which is contained in the cathode-sealing portion and connected to its cathode rod. The electric potential of the electrically-conductive member is thus kept equal to that of the sealed cathodic conductor while the dc discharge lamp is in operation. As a result, the air-tight connection between the sealed cathodic conductor and the quartz glass of the cathode-sealing portion is maintained stably over a long period of time. Such a dc discharge lamp assures long service life and high reliability.

6 Claims, 7 Drawing Figures

DC DISCHARGE LAMP

BACKGROUND OF THE INVENTION

1. Field of the Invention:

This invention relates to a dc discharge lamp suitable for use as a light source, for example, in the ultraviolet ray exposure step of a fabrication process for semiconductors.

2. Description of the Prior Art:

In the fabrication of semiconductors for example, ultraviolet rays are used to print circuit patterns on silicon wafers. As light sources for giving off ultraviolet rays, super high pressure mercury vapor lamps are usually used.

In one example of super high pressure mercury vapor lamps which have conventionally been used in the fabrication of semiconductors, the super high pressure mercury vapor lamp is, as illustrated by way of example in FIG. 4, composed of a quartz glass envelope 1, an anode rod 4 and a cathode rod 5 extending at one ends thereof into the interior of the envelope 1 and fixedly disposed at the other ends thereof in an anode-sealing portion 2 and a cathode-sealing portion 3 respectively, a sealed anodic conductor 6 and a sealed cathodic conductor 7 embedded hermetically in the anode sealing portion 2 and cathode-sealing portion 3 respectively and formed of molybdenum foils which are respectively connected at one ends thereof to the anode rod 4 and cathode rod 5, an outer anodic lead 8 and an outer cathodic lead 9 provided fixedly in the anode-sealing portion 2 and cathode-sealing portion 3 respectively in such a way that the leads 8,9 are connected at one ends thereof to the sealed conductors 6,7 respectively and the other ends of the leads 8,9 project out from the anode-sealing portion 2 and cathode-sealing portion 3 respectively, and a metallic anode base 10 and a metallic cathode base 11 connected electrically to the leads 8,9 respectively and provided fixedly on the anode-sealing portion 2 and cathode-sealing portion 3 respectively. Within the envelope 1 of the super high pressure mercury vapor lamp, mercury and an inert gas are contained. Upon operation, the internal pressure of the envelope 1 increases to a pressure, for example, as high as about 10-50 atms.

Molybdenum foils are used as the sealed conductors 6,7, because the molybdenum foils can undergo plastic deformations to facilitate the maintenance of air tightness at the sealing portions 2,3 even for significant temperature variations to be induced by repeated turn-on and turn-off of the lamp. From the viewpoint of maintenance of air tightness, the thinner the metallic foils 6,7, the better. However, the thickness may generally be several tens micrometers or preferably, about 20 $\mu$m or so when the electrical capacity, mechanical strength or the workability upon manufacture of such mercury vapor lamps is taken into consideration.

However, such conventional supervoltage mercury lamps have been found to involve a problem that even where their service life periods had been designed to reach, for example, 400 hours, they failed in many instances in about 100 to 300 hours; and due to such prematured failure, the ultraviolet exposure processing was frequently interrupted during the ultraviolet ray exposure step of a fabrication process of semiconductors and the smooth accomplishment of the fabrication process of the semiconductors was hence impaired.

With the foregoing in view, the present inventor made an investigation on super high pressure mercury vapor lamps which had failed prematurely. The investigation resulted in a finding that as shown partly on an enlarged scale in FIG. 5, a gap 32 was formed between the sealed conductor 7 and a glass portion 31 of the cathode-sealing portion 3 and only in the cathode-sealing portion 3. Namely, even if the gap 32 is small in the beginning, it appears to propagate little by little toward the outer cathodic lead 9 as the operation time becomes longer. Accordingly, the air-tight structure between the sealed conductor 7 and the glass portion 31 of the cathode-sealing portion 3 is eventually broken and the super high pressure mercury vapor lamp hence becomes inoperative. The present invention has been completed on the basis of such a finding.

SUMMARY OF THE INVENTION

With the foregoing in view, the present invention has as its object the provision of a dc discharge lamp assuring prolonged service life and high reliability, which attains the maintenance of air tightness at its cathode-sealing portion without failure over a long period of time even if the internal pressure of its envelope becomes high during its operation when used as a light source, for example, in the ultraviolet ray exposure step of a semiconductor fabrication process, makes it possible to proceed with the ultraviolet ray exposure without any unexpected interruption and hence to carry out the semiconductor fabrication process smoothly.

In one aspect of this invention, there is thus provided a dc discharge lamp equipped with a quartz glass envelope, sealed anodic and cathodic conductors enclosed respectively within anode- and cathode-sealing portions of the envelope, outer anodic and cathodic leads connected at one ends thereof to the sealed anodic and cathodic conductors respectively and projecting out of the envelope at the outer ends thereof, and anode and cathode rods disposed fixedly in the anode- and cathode-sealing portions respectively in such a way that the anode and cathode rods are electrically connected at one ends thereof to the sealed anodic and cathodic conductors respectively and the other ends of the anode and cathode rods project into the interior of the envelope. An electrically-conductive member is provided on the outer wall of the cathode-sealing portion and the electrically-conductive member is electrically connected to the sealed cathodic conductor.

Owing to the provision of the electrically-conductive member on the outer wall of the cathode-sealing portion in such a way that the electrically-conductive member is electrically connected to the sealed cathodic conductor, the electric potential of the electrically-conductive member is kept equal to that of the sealed cathodic conductor while the dc discharge lamp is in operation. As a result, as will be understood from a description on an exemplary experiment which will be described herein, the air-tight connection between the sealed cathodic conductor and the quartz glass is maintained stably for a long period of time and as a matter of fact, a dc discharge lamp having long service life and high reliability can thus be provided. By using such a dc discharge lamp as a light source in the ultraviolet ray exposure step of a semiconductor fabrication process, it is possible to avoid unexpected interruption of ultraviolet ray exposure and thus to carry out the semiconductor fabrication process smoothly for a long period of time.

The above and other objects, features and advantages of the present invention will become apparent from the following description and the appended claims, taken in conjunction with the accompanying drawings.

DETAILED DESCRIPTION OF THE INVENTION AND PREFERRED EMBODIMENTS

Figure 1:
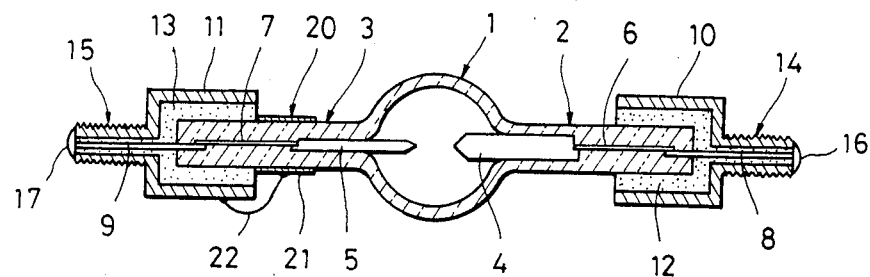
FIGS. 1(a) and 1(b) are respectively schematic longitudinal transverse cross-sections of a dc discharge lamp according to one embodiment of this invention.
Figure 1:
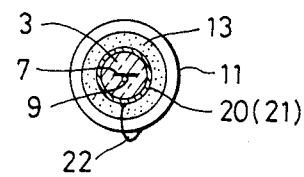

Referring first to FIGS. 1(a) and 1(b), the first embodiment of this invention will hereinafter be described. In this embodiment, a super high pressure mercury vapor lamp is constructed as a dc discharge lamp.

Numeral 1 indicates an envelope made of quartz glass, while numerals 2 and 3 designate an anode-sealing portion and a cathode-sealing portion respectively.

In the cathode-sealing portion 3, a sealed cathodic conductor 7 which is formed of a molybdenum foil is embedded hermetically in the glass of the cathode-sealing portion 3. A cathode rod 5 is fixedly disposed in the cathode-sealing portion 3 in such a way that one end of the cathode rod 5 is connected to one end of the sealed cathodic conductor 7 and the other end of the cathode rod 5 extends into the interior of the envelope 1. An outer cathodic lead 9 is fixedly disposed in the glass of the cathode-sealing portion 3 in such a way that one end of the outer cathodic lead 9 is connected to the other end of the sealed cathodic conductor 7 and the other end of the outer cathodic lead 9 projects out of the envelope 1. In the anode-sealing portion 2, there are provided a sealed anodic conductor 6 made of a molybdenum foil, an anode rod 4 and an outer anodic lead 8 in much the same way as in the above-described cathode-sealing portion 3.

Designated at numerals 10,11 are a metallic anode base and a metallic cathode base, each of a cylindrical configuration, provided on the anode-sealing portion 2 and cathode-sealing portion 3 respectively. These metallic bases 10,11 are respectively fixed on the anode-sealing portion 2 and cathode-sealing portion 3 by cements 12,13. Furthermore, the outer anodic and cathodic leads 8,9 are respectively brazed and connected to the metallic bases 10,11 at tips 16,17. Numerals 14,15 indicate external threads for mounting the super high pressure mercury vapor lamp.

Numeral 20 indicates an electrically-conductive member. In the embodiment depicted in FIG. 1, the electrically-conductive member 20 is formed by providing a metal deposition film 21, which is made of a metal such as Pt(platinum), Au(gold), Pd(palladium), Ag(silver), Ni(nickel) or Re(rhenium), on substantially the entire circumference of the outer wall of the glass portion which surrounds the sealed cathodic conductor 7 in the cathode-sealing portion 3. The electrically-conductive member 20 may be formed by providing a metal deposition film or films on one or more sections of the wall of the glass portion opposite to the surface of the sealed cathodic conductor 7. The metal deposition film may be formed by means of vacuum evaporation process, sputtering process, chemical vapor deposition process or the like.

The metal deposition film 21 is connected to the metallic cathode base 11 by way of a connection wire 22 made, for example, of stainless steel, whereby the metal film 21 is kept in a state electrically connected to the sealed cathodic conductor 7. The thickness of the metal deposition film 21 may for example be about 0.5-5 μm.

The envelope 1 is filled with mercury, an inert gas and the like in such amounts that the internal pressure of the envelope 1 reaches about 3014 40 atms when the super high pressure mercury vapor lamp is in operation.

Owing to the above-described construction, the electric potential of the electrically-conductive member 20 is kept equal to that of the sealed cathodic conductor 7 while the super high pressure mercury vapor lamp is in operation. As a result, as will be understood from the description on the below-described experiment, the air-tight connection between the sealed cathodic conductor 7 and its associated quartz glass is maintained stably for a long period of time. Consequently, the above-described construction can provide a super high pressure mercury vapor lamp having long service life and high reliability.

The above-described stable maintenance of the air-tight connection between the sealed cathodic conductor 7 and its associated quartz glass over a long period of time may be attributed at least partly to the following reasons. While the super high pressure mercury vapor lamp is in operation, the intensity of electric field is kept substantially at 0 in the glass portion between the sealed cathodic conductor 7 and electrically-conductive member 20. Accordingly, it is practically possible to avoid movement of cations of metallic impurities, which are usually contained in quartz glass unavoidably, under an electric field. Movement of such cations is considered to be a cause for impairing the air-tight connection between the sealed cathodic conductor 7 and its associated quartz glass. As a result, it is possible to avoid concentration of cations of such metallic impurities at the portion where the sealed cathodic conductor 7 and its associated quartz glass are connected. As a consequence, it is believed that the air-tight connection between the sealed cathodic conductor 7 and its associated quartz glass is not damaged and the air-tight connection is stably maintained for a long period of time.

A great merit is thus obtained from the use of such a super high pressure mercury vapor lamp as a light source in an ultraviolet ray exposure step of a semiconductor fabrication process, because the use of the super high pressure mercury vapor lamp makes it possible to reduce the initial cost and also to perform trouble-free ultraviolet ray exposure over a long period of time.

Unlike the above-described super high pressure mercury vapor lamp of this invention, a conventional super high pressure mercury vapor lamp becomes very hot at the cathode-sealing portion 3 while the lamp is in operation. Therefore, cations of metallic impurities usually contained in quartz glass are thermally excited in the cathode-sealing portion 3. Moreover, a negative voltage is applied to the sealed cathodic conductor 7. In the quartz glass of the cathode-sealing portion 3, a strong electric field is therefore produced in a direction advancing from the quartz glass to the sealed cathodic conductor 7. Due to this electric field, cations of the metallic impurities in the silica glass are believed to concentrate in the vicinity of the interface between the quartz glass and sealed cathodic conductor 7. This concentration of cations is believed to lead to damage to the connection between the sealed cathodic conductor 7 and its associated quartz glass so that a gap is formed therebetween. In addition, this gap is believed to become greater little by little due to the high pressure developed in the envelope 1 while the super high pressure mercury lamp is in operation, as the operation time becomes longer. As a result, the gap between the sealed cathodic conductor 7 and its associated quartz glass eventually communicates with the surrounding atmosphere of the envelope 1 so that the service life of the super high pressure mercury vapor lamp is shortened.

Based on the above embodiment, ten super high pressure mercury vapor lamps of the following specification were fabricated.

Rated power consumption: 450 W (50 V, 9 A)
Interelectrode distance: 2.2 mm
Pressure in the envelope 1 (during in operation): 40 atms
Filled materials: Mercury, argon
Thickness of the sealed cathodic conductor 7: 0.02 mm
Length of the sealed cathodic conductor 7: 19 mm
Material of the metal deposition film 21: Gold
Length of the metal deposition film 21: 11 mm
Thickness of the metal deposition film 21: 0.001 mm A continuous lighting test was actually conducted for 400 hours on each of the ten super high pressure mercury vapor lamps. All the ten super high pressure mercury vapor lamps were able to work stably until the end of the test.

For the sake of comparison, ten super high pressure mercury vapor lamps were fabricated in the same manner as described above except that the metal deposition films 21 were not provided. An actual lighting test was conducted on the ten super high pressure mercury vapor lamps in the same manner as described above. Three super high pressure mercury vapor lamps out of the above-tested super high pressure mercury vapor lamps failed in 100–300 hours. Their service lines were thus short.

Figure 2:
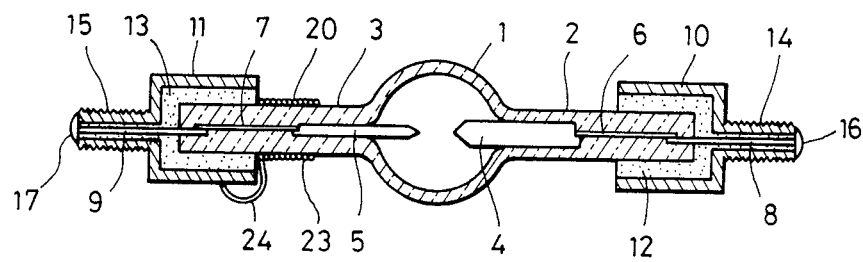
FIGS. 2(a) and 2(b) are respectively schematic longitudinal transverse cross-sections of a dc discharge lamp according to another embodiment of this invention.
Figure 2:
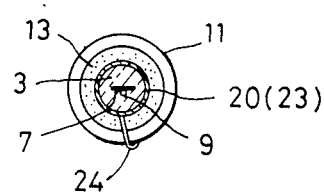

Another embodiment of this invention is schematically illustrated in FIGS. 2(a) and 2(b), in which the electrically-conductive member 20 is formed by winding a metal wire 23 on the outer wall of the cathode-sealing portion 3. The metal wire 23 is made of a nickel-chromium steel wire the diameter of which may, for example, range from 0.15 mm to 0.3 mm. Designated at numeral 24 is a connection wire which has established an electrical connection between the metal wire 23 and metallic cathode base 11.

Similar to the first-mentioned embodiment, the construction of this embodiment can also maintain an airtight connection between the sealed cathodic conductor 7 and its associated quartz glass stably over a long period of time and can thus provide a super high pressure mercury vapor lamp having long service life and high reliability.

The electrically-conductive member 20 may be formed by wrapping a metal foil or winding a metal strip in place of winding a metal wire 23.

Figure 3:
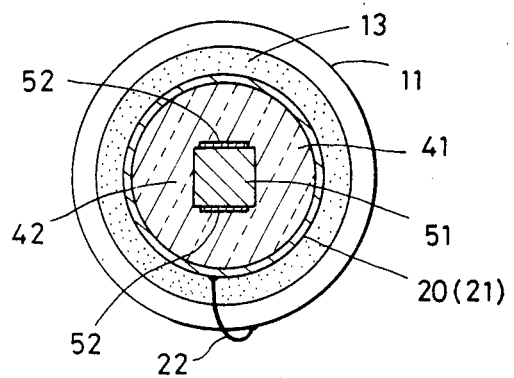
FIG. 3 is a schematic transverse cross-section showing a modification.
Figure 4:
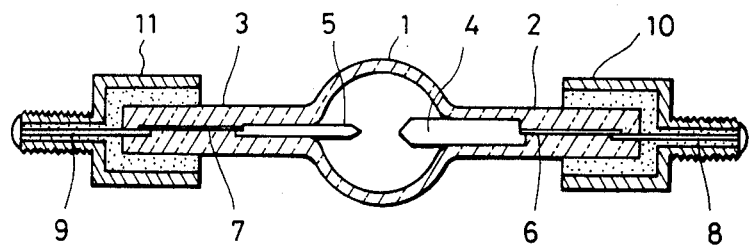
FIG. 4 is a schematic longitudinal cross-section of one example of conventional supervoltage mercury vapor lamps.
Figure 5:
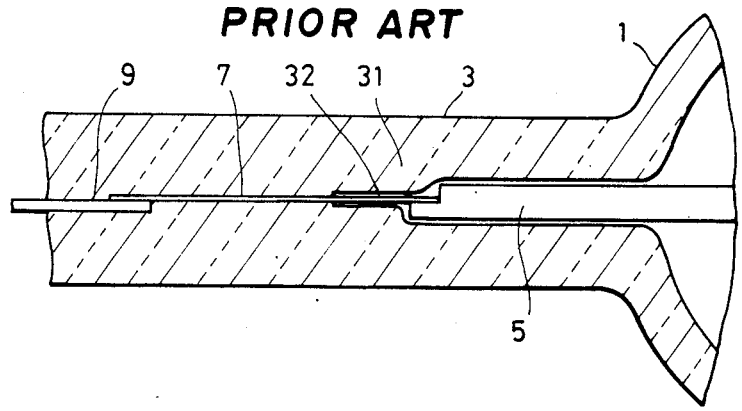
FIG. 5 is a schematic cross-sectional view showing a part of the conventional supervoltage mercury vapor lamp of FIG. 4 on an enlarged scale.

It may be feasible to design each of the above super high pressure mercury vapor lamps of this invention into such a structure that two or more sealed cathodic conductors which are each formed of a molybdenum foil are used in its cathode-sealing portion. As illustrated by way of example in FIG. 3, an auxiliary glass member 51 having a configuration similar to a square block and made of quartz glass is provided within the cathode-sealing portion 41. Plural sheets of cathodic conductors 52 are then arranged on the outer walls of the auxiliary glass member 51 in such a way that the cathodic conductors 52 extend along the length of the auxiliary glass member 51. These cathodic conductors 52 are then hermetically interposed and sealed between the auxiliary glass member 51 and an outer tube 42. This modified structure is suitable for allowing passage of a large current.

Having now fully described the invention, it will be apparent to one of ordinary skill in the art that many changes and modifications can be made thereto without departing from the spirit or scope of the invention as set forth herein.

What is claimed is:

1. In a dc discharge lamp equipped with a quartz glass envelope, sealed metallic foil anodic and cathodic conductors enclosed respectively within anode-sealing and cathode-sealing portions of the envelope, outer anodic and cathodic leads each connected at one end thereof to the sealed anodic and cathodic conductors respectively and each projecting at the other end thereof out of the envelope, metallic anode and cathode bases fixed on the anode-sealing and cathode-sealing portions respectively, and anode and cathode rods disposed fixedly in the anode-sealing and cathode-sealing portions respectively in such a way that the anode and cathode rods are each electrically connected at one end thereof to the sealed anodic and cathodic conductors respectively and the other end of each of the anode and cathode rods projects into the interior of the envelope, the improvement comprising an electrically-conductive member provided on the outer surface of the cathode-sealing portion and means for electrically connecting the electrically-conductive member and the sealed cathodic conductor, wherein the electrically-conductive member overlies at least a portion of the sealed cathodic conductor adjacent to the cathode rod.

2. A dc discharge lamp as claimed in claim 1, wherein the outer cathode lead is connected to the metallic cathode base and the electrically-conductive member is connected to the metallic cathode base by the means for electrically connecting comprising a connection wire, whereby the electrically-conductive member and sealed cathodic conductor are electrically connected to each other.

3. A dc discharge lamp as claimed in claim 1, wherein the electrically-conductive member is a metal deposition film.

4. A dc discharge lamp as claimed in claim 1, wherein the electrically-conductive member is composed of a metal wire or foil provided on the cathode-sealing portion.

5. A dc discharge lamp as claimed in claim 1, wherein the internal pressure of the envelope reaches 30–40 atms when the dc discharge lamp is lit.

6. A dc discharge lamp as claimed in claim 1, wherein the electrically-conductive member is in direct contact with the outer glass surface of the cathode-sealing portion.

* * * * *